US010969443B2

(12) United States Patent
Martinis

(10) Patent No.: US 10,969,443 B2
(45) Date of Patent: Apr. 6, 2021

(54) MAGNETIC FLUX CONTROL IN SUPERCONDUCTING DEVICES

(71) Applicant: The Regents of the University of California, Oakland, CA (US)

(72) Inventor: John Martinis, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/662,972

(22) Filed: Oct. 24, 2019

(65) Prior Publication Data
US 2020/0064412 A1 Feb. 27, 2020

Related U.S. Application Data

(62) Division of application No. 15/614,287, filed on Jun. 5, 2017, now Pat. No. 10,488,469.

(51) Int. Cl.
*G11C 11/44* (2006.01)
*G01R 33/00* (2006.01)
(Continued)

(52) U.S. Cl.
CPC ....... *G01R 33/0023* (2013.01); *G01R 33/035* (2013.01); *G06N 10/00* (2019.01); *G11C 11/44* (2013.01); *G11C 11/5628* (2013.01)

(58) Field of Classification Search
CPC ..... G11C 11/00; G11C 11/44; G11C 11/5628; G01R 33/0023; G01R 33/035; G06N 10/00
(Continued)

(56) References Cited

U.S. PATENT DOCUMENTS 5,334,884 A 8/1994 Tesche
5,610,857 A 3/1997 Nandakumar
(Continued)

FOREIGN PATENT DOCUMENTS

KR 10-2008-0025363 3/2008

OTHER PUBLICATIONS

Mizugaki, Y., et al., "Single-flux-quantum pump based on a three-junction superconducting quantum interference device", Applied Physics Letters, Jun. 17, 2002, pp. 4585-4587, vol. 80, No. 2.
(Continued)

*Primary Examiner* — Harry W Byrne
(74) *Attorney, Agent, or Firm* — Gates & Cooper LLP

(57) ABSTRACT

A method includes generating a bias signal from a first device, and applying the bias signal to a second device, the first device having (a) a superconducting trace and (b) a superconducting quantum interference device (SQUID), in which a first terminal of the SQUID is electrically coupled to a first end of the superconducting trace, and a second terminal of the SQUID is electrically coupled to a second end of the superconducting trace, where generating the bias signal from the first device includes: applying a first signal $\Phi_1$ to a first sub-loop of the SQUID; and applying a second signal $\Phi_2$ to a second sub-loop of the SQUID, in which the first signal $\Phi_1$ and the second signal $\Phi_2$ are applied such that a value of a superconducting phase of the first device is incremented or decremented by a non-zero integer multiple n of $2\pi$.

12 Claims, 8 Drawing Sheets

(51) Int. Cl.
*G06N 10/00* (2019.01)
*G01R 33/035* (2006.01)
*G11C 11/56* (2006.01)

(58) Field of Classification Search
USPC ................................. 365/106, 129–173, 200
See application file for complete search history.

(56) References Cited

U.S. PATENT DOCUMENTS

| | | | |
|---|---|---|---|
| 7,898,282 B2 | 3/2011 | Harris et al. | |
| 8,571,614 B1* | 10/2013 | Mukhanov | H01L 27/18 505/170 |
| 9,240,773 B1* | 1/2016 | Mukhanov | H01L 27/18 |
| 9,443,576 B1 | 9/2016 | Miller | |
| 9,473,124 B1* | 10/2016 | Mukhanov | H01L 27/18 |
| 9,853,645 B1* | 12/2017 | Mukhanov | H01L 27/18 |
| 2016/0267032 A1 | 9/2016 | Rigetti et al. | |

OTHER PUBLICATIONS

PCT International Search Report dated Sep. 25, 2018 for PCT Application No. PCT/US2018/35860.
Australian Examination Report dated Sep. 24, 2020 for Australian Patent Application No. 2018282100.
Korean Office Action (with English translation) dated Nov. 26, 2020 for Korean Patent Application No. 10-2020-7000214.
Chiarello, F., et al., "An Optimal Tunable Josephson Element for Quantum Computing", Applied Physics Letters, Jul. 2008, pp. 1-3, vol. 93.
Canadian Office Action dated Feb. 9, 2021 for Canadian Patent Application No. 3,065,337.

* cited by examiner

| $\Delta\varphi$ | Output state | Binary Value |
|---|---|---|
| 0 | $n$ | 00 |
| $2\pi$ | $n+1$ | 01 |
| $4\pi$ | $n+2$ | 10 |
| $6\pi$ | $n+3$ | 11 |

FIG. 8

MAGNETIC FLUX CONTROL IN SUPERCONDUCTING DEVICES

CROSS REFERENCE TO RELATED APPLICATION

This application is a divisional under 35 U.S.C. Section 121 of the following co-pending and commonly-assigned application:

U.S. Utility patent application Ser. No. 15/614,287, filed on Jun. 5, 2017, by John Martinis, entitled "MAGNETIC FLUX CONTROL IN SUPERCONDUCTING DEVICES,");

which application is incorporated by reference herein.

TECHNICAL FIELD

The present disclosure relates to magnetic flux control in superconducting devices.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, some aspects, the subject matter of the present disclosure can be embodied in methods that include generating a bias signal from a first device, and applying the bias signal to a second device, the first device including (a) a superconducting trace and (b) a superconducting quantum interference device (SQUID) having at least three non-linear inductor junctions coupled in parallel, in which a first terminal of the SQUID is electrically coupled to a first end of the superconducting trace, and a second terminal of the SQUID is electrically coupled to a second end of the superconducting trace to form a loop, in which generating the bias signal from the first device includes: applying a first time-varying magnetic flux $\Phi_1$ to a first sub-loop of the SQUID; and applying a second time-varying magnetic flux $\Phi_2$ to a second sub-loop of the SQUID, in which the first time-varying magnetic flux $\Phi_1$ and the second time-varying magnetic flux $\Phi_2$ are applied such that a value of a superconducting phase of the first device is incremented or decremented by a non-zero integer multiple n of $2\pi$.

Implementations of the methods can include one or more of the following features. For example, in some implementations, the output state includes an effective phase offset of a current through the first device.

In some implementations, the output state includes an effective flux through the first device.

In some implementations each of a maximum magnitude of the first time-varying magnetic flux $\Phi_1$ and a maximum magnitude of the second time-varying magnetic flux $\Phi_2$ is less than the flux quantum $\Phi_0$.

In some implementations, a ratio, $\Phi_1/\Phi_0$, of the first time-varying magnetic flux $\Phi_1$ to the flux quantum $\Phi_0$, and a ratio, $\Phi_2/\Phi_0$, of the second time-varying magnetic flux $\Phi_2$ to the flux quantum $\Phi_0$ trace a path around a point where a current value through the first device is 0. The ratio $\Phi_1/\Phi_0$ and the ratio $\Phi_2/\Phi_0$ can be, e.g., approximately equal to ⅓ at the point where the current through the first device is 0. The integer multiple n can be incremented when the ratio $\Phi_1/\Phi_0$ and the ratio $\Phi_2/\Phi_0$ trace the path along a first direction around the point where the current through the first device is 0, or decremented when the ratio $\Phi_1/\Phi_0$ and the ratio $\Phi_2/\Phi_0$ trace the path along a second direction that is opposite to the first direction. The path can be a closed-loop path.

In some implementations, a ratio, $\Phi_1/\Phi_0$, of the first time-varying magnetic flux $\Phi_1$ to the flux quantum $\Phi_0$, and a ratio, $\Phi_2/\Phi_0$, of the second time-varying magnetic flux $\Phi_2$ to the flux quantum $\Phi_0$ trace a path through a point where an effective phase offset of the current through the first device is 0. The path can be a closed-loop path.

In some implementations, applying the first time-varying magnetic flux and the second time-varying magnetic flux includes changing the phase associated with each Josephson junction of the SQUID by $2\pi$.

In some implementations, the method includes cooling the first device to below the superconducting critical temperature of a superconducting material in the superconducting trace.

In some implementations, the first time-varying magnetic flux $\Phi_1$ and the second time-varying magnetic flux $\Phi_2$ are sequentially applied. The first time-varying magnetic flux $\Phi_1$ and the second time-varying magnetic flux $\Phi_2$ can overlap in time.

In general, in some other aspects, the subject matter of the present disclosure can be embodied in devices that include: a first device having a superconducting trace, and a superconducting quantum interference device (SQUID) having at least three non-linear inductor junctions coupled in parallel, in which a first terminal of the SQUID is electrically coupled to a first end of the superconducting trace, and a second terminal of the SQUID is electrically coupled to a second end of the superconducting trace to form a loop; and a second device arranged proximate to the first device, in which a state of the second device is controllable by a bias generated by the first device.

Implementations of the devices can include one or more of the following features. For example, in some implementations, the second device is a qubit.

In some implementations, the second device is a qubit coupler element.

In general, in some other aspects, the subject matter of the present disclosure can be embodied in systems that include: multiple cells arranged in an array of M rows by N columns, M being an integer number greater than or equal to 1, N being an integer number greater than or equal to 2, in which each cell of the multiple cells includes a corresponding magnetic flux control device having: a superconducting trace, and a superconducting quantum interference device (SQUID) having at least three non-linear inductor junctions coupled in parallel, in which a first terminal of the SQUID is electrically coupled to a first end of the superconducting trace, and a second terminal of the SQUID is electrically coupled to a second end of the superconducting trace to form a loop.

Implementations of the systems can include one or more of the following features. For example, in some implementations, each cell of the multiple cells further includes a corresponding second device positioned proximate to the magnetic flux control device. In some implementations, for each cell of the multiple cells, the second device includes a qubit.

In some implementations, for each cell of the multiple cells, the second device includes a qubit coupler element.

In some implementations, the systems further include: M first control lines, in which each first control line of the M first control lines extends along a corresponding row of the array and is couplable to each magnetic flux control device within the corresponding row; and N second control lines, in which each second control line of the N control lines extends along a corresponding column of the array is couplable to each magnetic flux control device within the corresponding column. The systems can further include: a row select generator coupled to the M first control lines, the row select generator being configured to provide a unique corresponding signal to each first control line of the M first control lines; and a column select generator coupled to the N second control lines, the column select generator being configured to provide a unique corresponding signal to each second control line of the N second control lines.

In general, in some other aspects, the subject matter of the present disclosure can be embodied in methods of operating a multi-level memory device that includes (a) a superconducting trace and (b) a superconducting quantum interference device (SQUID) having at least three non-linear inductor junctions coupled in parallel, in which a first terminal of the SQUID is electrically coupled to a first end of the superconducting trace, and a second terminal of the SQUID is electrically coupled to a second end of the superconducting trace to form a loop, the methods including: applying a first time-varying magnetic flux $\Phi_1$ to a first sub-loop of the SQUID, and applying a second time-varying magnetic flux $\Phi_2$ to a second sub-loop of the SQUID, to place the multi-level memory device in a first memory state.

Implementations of the methods can include one or more of the following features. For example, in some implementations, applying the first time-varying magnetic flux $\Phi_1$ and applying a second time-varying magnetic flux $\Phi_2$ causes an output state of the multi-level memory device to change by a non-zero integer n.

In some implementations, the methods include applying a third time-varying magnetic flux $\Phi_3$ to the first sub-loop of the SQUID, and applying a fourth time-varying magnetic flux $\Phi_4$ to the second sub-loop of the SQUID, to place the multi-level memory device in a second memory state, wherein the second memory state is different than the first memory state.

Particular implementations of the subject matter described here can realize one or more of the following advantages. For example, in some implementations, the magnetic flux control devices of the present disclosure are capable of dissipating substantially little power, and thus providing an advantageous option as control devices for quantum computing circuit elements. For example, in certain implementations, the magnetic flux control devices of the present disclosure can dissipate a factor of $10^3$-$10^5$ less power than CMOS-based or SFQ-based control devices. Because the power dissipation, and thus heat generation, of the magnetic flux control devices is so low, the control devices can, in certain implementations, even be arranged on the same chip as the quantum computing circuit elements without substantially increasing the local chip temperature and/or without causing transitions to undesired energy states. In some implementations, the magnetic flux control devices of the present disclosure can be operated as logical AND gates, where a HIGH output (e.g., a change in the magnetic flux control device output state) results only if both inputs meet a predetermined criteria, and a LOW output (e.g., no change in the magnetic flux control device output state) results if any of the inputs do not meet the predetermined criteria. Multiple magnetic flux control devices can be arranged in an array or matrix configuration to provide multiplexed control for multiple quantum computing circuit elements. In some implementations, the magnetic flux control devices of the present disclosure can be operated as multi-level memory devices.

The details of one or more implementations are set forth in the accompanying drawings and the description below. Other features and advantages will be apparent from the description, the drawings, and the claims.

BRIEF DESCRIPTION OF THE DRAWINGS

FIG. 8 is a table that illustrates an example of different output states that can be established by a multi-level memory

DETAILED DESCRIPTION

Figure 1:
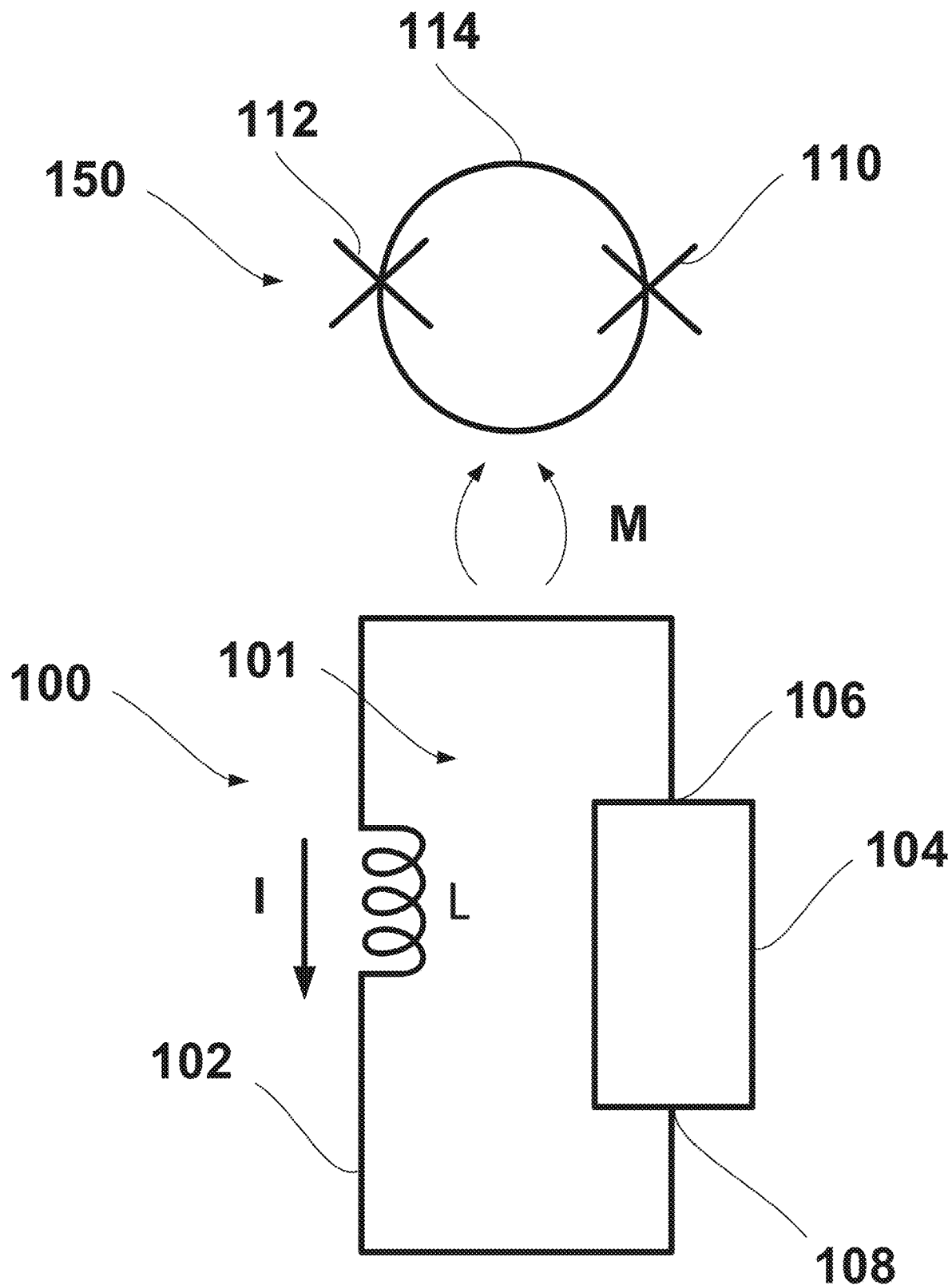
FIG. 1 is a schematic illustrating an example of a magnetic flux control device and a qubit.

Quantum computing entails coherently processing quantum information stored in the quantum bits (qubits) of a quantum computer. Superconducting quantum computing is a promising implementation of quantum computing technology in which quantum computing circuit elements are formed, in part, from superconducting materials. Superconducting quantum computers are typically multilevel systems, in which the two lowest energy levels are used as the computational basis. It is preferably to operate quantum circuit elements (e.g., quantum computing circuit elements) with low energy loss and dissipation (e.g., the quantum computing circuit elements exhibit a high quality factor, Q). Low energy loss and dissipation may help to avoid, e.g., quantum decoherence and/or transitions to other undesired energy states.

One source of loss and dissipation is heat generated from control elements, such as qubit control elements. Qubit control elements can have different functions. For example, in some cases, a qubit control element provides control signals (e.g., flux biases) to tilt/perturb the double well potential during operation of the qubit. In some cases, a qubit control element provides control signals to adjust the magnitude of the barrier between the potential wells during operation of the qubit or to change the operating frequency of the qubit. Additional control functions are also possible. Another example of a control element includes the qubit coupler control element, which provides, e.g., control signals to modify the coupling strength between qubits and qubit coupler elements. Other control elements also are possible.

In general, the control elements can be sources of relatively high power dissipation, and thus heat generation. When such a control element is arranged on the same chip as the superconducting quantum computing circuit elements (e.g., qubits), the level of local energy dissipation may lead to heating that can be significant relative to the low temperatures (e.g., ~20 mK) at which the quantum computing circuit elements need to be maintained to achieve superconductivity. The high level of energy dissipation and subsequent heat generation therefore can render it difficult to achieve the low temperatures at which the devices are required to operate. Even for low power alternatives, such as single flux quantum (SFQ) digital logic devices, the level of power dissipation still may be too high.

The present disclosure is directed to magnetic flux control devices capable of dissipating substantially little power, and thus providing an advantageous option as control devices for quantum computing circuit elements. For example, in certain implementations, the magnetic flux control devices of the present disclosure can dissipate a factor of $10^3$-$10^5$ less power than CMOS-based or SFQ-based control devices. Accordingly, because the power dissipation, and thus heat generation, of the magnetic flux control devices is so low, the control devices can, in certain implementations, even be arranged on the same chip as the quantum computing circuit elements without substantially increasing the local chip temperature and/or without causing transitions to undesired energy states.

Changing an output state of the magnetic flux control device includes sequentially applying multiple separate time-varying input signals (e.g., magnetic flux signals $\Phi_1$, $\Phi_2$) to the magnetic flux control device, in which the time-varying input signals meet predetermined criteria. The predetermined criteria can include causing a superconducting phase of the magnetic flux control device to change by $2\pi n$, where n is a non-zero integer number. More specifically, the predetermined criteria can include applying the input signals (e.g., magnetic flux signals e.g., $\Phi_1$ and $\Phi_2$) such that a ratio of the input signals to a flux quantum $\Phi_0$ (e.g., $\Phi_1/\Phi_0$ and $\Phi_2/\Phi_0$) trace a path, e.g., a closed-loop path, around a critical point. The critical point can correspond to where a current I through the device is 0. The critical point can occur, e.g., when $\Phi_1/\Phi_0 = \Phi_2/\Phi_0 \leq 1/3$. In some implementations, the predetermined criteria can include applying the input signals (e.g., magnetic flux signals $\Phi_1$ and $\Phi_2$) such that a ratio of the input signals to a flux quantum $\Phi_0$ (e.g., $\Phi_1/\Phi_0$ and $\Phi_2/\Phi_0$) trace a path, e.g., a closed-loop path, through a point where an effective phase offset of a current/of the magnetic flux control device is 0.

When the applied flux meets the predetermined criteria, the output state of the magnetic flux control device changes. For example, an effective flux (as distinguished from the fields that are applied to the magnetic flux control device) through the magnetic flux control device changes by a non-zero integer number n of flux quantum $\Phi_0$. In contrast, when the applied flux signals do not meet the predetermined criteria, the output state of the magnetic flux control device does not change. For example, the effective flux through the magnetic flux control device does not change. Accordingly, in some implementations, the magnetic flux control device of the present disclosure can be operated as a logical AND gate, where a HIGH output (e.g., a change in the magnetic flux control device output state) results only if both inputs meet a predetermined criteria, and a LOW output (e.g., no change in the magnetic flux control device output state) results if any of the inputs do not meet the predetermined criteria. Multiple magnetic flux control devices can be arranged in an array or matrix configuration to provide multiplexed control for multiple quantum computing circuit elements.

In some implementations, the magnetic flux control device of the present disclosure can be operated as a multi-level memory device. That is, since the output state (e.g., the effective flux or the superconducting phase) of the magnetic flux control device is proportional to n, each integer change in n can correspond to a different memory state. As will be understood from present disclosure, other applications and advantages of the magnetic flux control device are also possible.

FIG. 1 is a schematic illustrating an example of a magnetic flux control device 100 and a second device 150, such as a qubit. Both the control device 100 and the second device 150 can be formed on a dielectric substrate, such as silicon or sapphire. In the present example, the second device 150 is a two-junction qubit including a superconducting trace 114 arranged in a loop or ring-like structure. The superconducting trace 114 is coupled in two separate locations to corresponding non-linear inductor junctions 110, 112. In the examples disclosed herein, a non-linear inductor junction can include a Josephson junction, which is a quantum-mechanical device made of two superconducting electrodes separated by an insulating barrier. An example of a Josephson junction includes a layer of aluminum oxide sandwiched between a first layer of aluminum and a second layer of aluminum. Superconducting trace 114 can be formed from material capable of achieving superconductivity. For example, trace 114 can be formed from aluminum or niobium. The second device 150 is not limited to the configuration shown in FIG. 1 and can include other designs, including other qubit designs, instead. For example, in some implementations, second device 150 includes a phase qubit, a charge qubit or a flux qubit. Examples of flux qubits that can be used include, e.g., a fluxmon qubit, a gmon qubit, or an x-mon qubit. The qubit can include two, three, four or other numbers of Josephson junctions. Other qubit configurations are also possible. Second device 150 can include devices other than qubits. For example, in some implementations, second device 150 includes a qubit coupler element. A qubit coupler element can include, for example, a resonator element, such as a superconducting resonator element.

Second device 150 is arranged proximately to the magnetic flux control device 100 so that second device 150 is exposed to a bias signal generated by the magnetic flux control device 100. The bias signal generated by the magnetic flux control device 100 can include a magnetic flux M generated by magnetic flux control device 100.

The magnetic flux control device 100 includes a superconducting trace 102, in which one end of the superconducting trace 102 is connected to a first terminal 106 of a superconducting quantum interference device (SQUID) 104 and a second end of the superconducting trace 102 is connected to a second terminal 108 of the SQUID 104 to form a ring-like structure or loop 101. Superconducting trace 102 can be formed from material capable of achieving superconductivity. For example, trace 102 can be formed from aluminum or niobium. Operation of the magnetic flux control device 100 includes cooling the magnetic flux control device 100 below the superconducting critical temperature of the superconducting materials in the device 100, and then applying multiple input signals (e.g., time-varying magnetic flux signals) to the SQUID 104, such that a current I is generated in the superconducting trace 102. The current I traveling through the superconducting trace 102 gives rise to the magnetic flux M that can inductively couple to the second device 150 positioned proximately to the magnetic flux control device 105.

The current I can be expressed as $I \approx n\Phi_0/L$, where n is an integer number, L is the dominant inductance of the loop (e.g., the inductance of the loop formed by the superconducting trace 102 and the SQUID 104), and $\Phi_0$ is the flux quantum, which can be expressed as h/2e, where h is Planck's constant and e is the charge on an electron.

A state of the second device 150 is controllable by the bias signal generated by the magnetic flux control device 100. That is, based on the particular magnetic flux signals applied to the SQUID 104, it is possible, in certain implementations, to change the value of n and, in turn, alter the current I or an effective magnetic flux M (where M can be expressed as approximately $M \approx n\Phi_0$) produced by the device 100 and received by second device 150. Accordingly, in some implementations, the magnetic flux control device 100 serves as a control element for an external device, such as second device 150. For example, the magnetic flux control device 100 can be used to modify the tilt of the qubit's potential well, modify the magnitude of the qubit's potential well barrier magnitude based on the value of n, or change the qubit's frequency.

Although second device 150 is shown in the example as a superconducting qubit, other devices can be used instead. For example, in some implementations, the bias signal generated by the magnetic flux control device 100 can be used to control a qubit coupler element. That is, the bias (e.g., the magnetic flux or the current signal) generated by device 100 can be varied to cause a corresponding change in the coupling strength of the qubit coupler element. Alternatively, the bias generated by device 100 can be varied to cause a corresponding change in frequency of the qubit coupler element.

Figure 2:
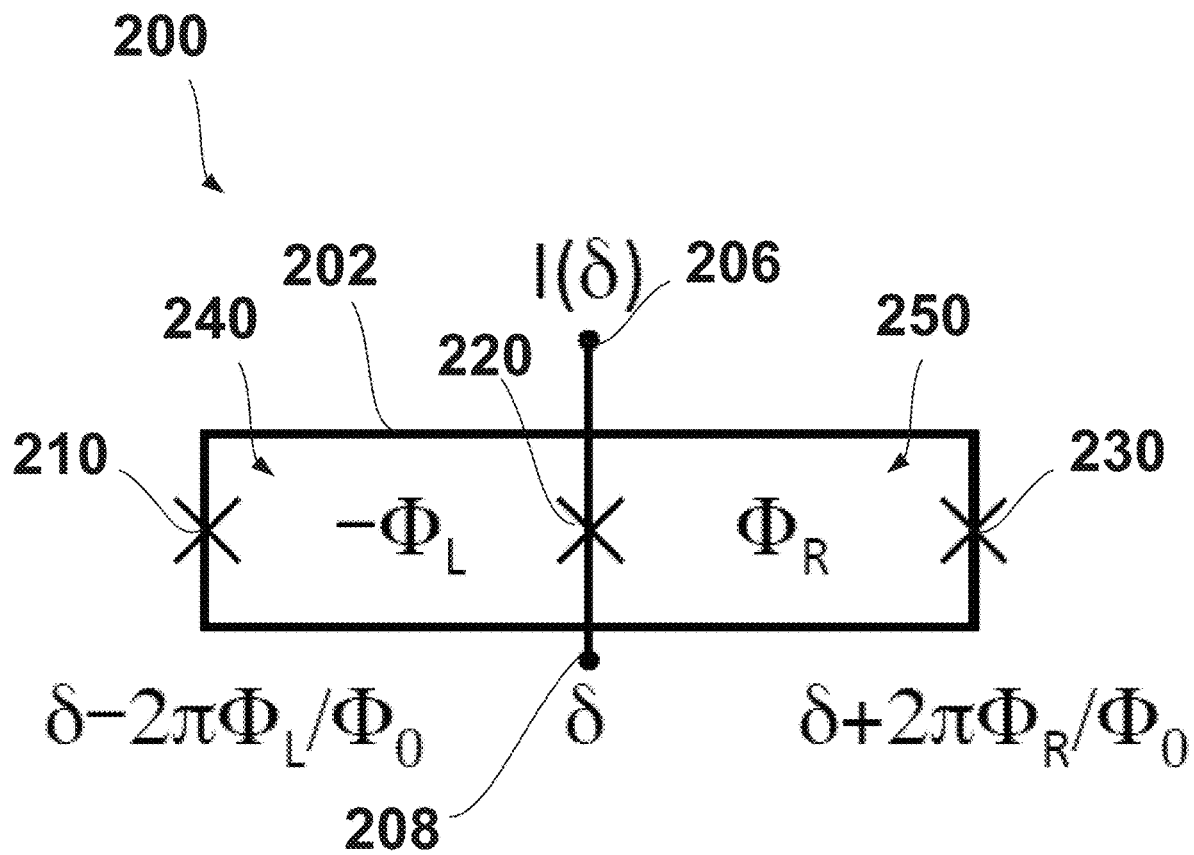
FIG. 2 is a schematic illustrating an example of a superconducting quantum interference device (SQUID) that can be used in a magnetic flux control device.

FIG. 2 is a schematic illustrating an example of a SQUID 200 that can be used as element 104 in the magnetic flux control device 100. SQUID 200 is a three junction SQUID, meaning that SQUID 200 includes three non-linear inductor junctions 210, 220, and 230. The non-linear inductor junctions 210, 220 and 230 are directly electrically coupled in parallel to one another at a first terminal 206 and a second terminal 208. For example, the non-linear inductor junctions 210, 220, and 230 can be electrically coupled in parallel through a superconducting trace 202. Superconducting trace 202 can be formed from material capable of achieving superconductivity. For example, trace 202 can be formed from aluminum or niobium. Terminal 206 is equivalent to terminal 106 and terminal 208 is equivalent to terminal 108, as shown in FIG. 1.

By coupling together the junctions 210, 220 and 230 in this manner, two loops (sub-loop 240 and sub-loop 250) are provided. Sub-loop 240 is defined by the current path through non-linear inductor junction 210, superconducting trace 202 and non-linear inductor junction 220. Sub-loop 250 is defined by the current path through non-linear inductor junction 220, superconducting trace 202 and non-linear inductor junction 230. When SQUID 200 is coupled to a superconductor trace, such as trace 102 in the example of FIG. 1, the sub-loops 240, 250 correspond to sub-loops of the larger ring defined by the current path through trace 102 and the SQUID 200.

Operation of magnetic flux control device 100 will be described herein using SQUID 200 as an example of element 104, though other SQUID designs are also possible for use as element 104. For example, though SQUID 200 is illustrated in FIG. 2 as having three-non-linear inductor junctions in parallel, SQUIDS with more than three non-linear inductor junctions can be used instead. In some implementations, SQUIDS having four, five, six or other numbers of non-linear inductor junctions coupled in parallel can be used instead. In cases where the SQUID includes more than three non-linear inductor junctions/more than two sub-loops, the output state of the magnetic flux control device still can be changed by applying a corresponding flux signal to each sub-loop, in which the flux signals meet predetermined criteria, as explained herein.

During operation of the magnetic flux control device 100, two input signals, e.g., time-varying magnetic flux signals $\Phi_L$, and $\Phi_R$, are applied to sub-loop 240 and sub-loop 250 of SQUID 200, respectively. The field can be provided by positioning separate inductors (e.g., superconducting traces) adjacent to each of sub-loops 240, 250 and providing current through the inductors to generate a magnetic field. The application of the time-varying fluxes to the two loops results in generation of a current through each non-linear inductor junction of SQUID 200. The current through junction 210 can be expressed as $I_0 \sin(\delta - 2\pi\Phi_L\Phi_0)$, where $I_0$ is the critical current through the junction (the value of which can be set by the junction fabrication process), $\delta$ is a phase difference across the device, and $\Phi_0$ is the flux quantum. The current through junction 230 can be expressed as $I_0 \sin(\delta + 2\pi\Phi_L\Phi_0)$. The current through the center junction 220 can be expressed as $I_0 \sin(\delta)$.

The current I ($\delta$) through SQUID 200 (i.e., the current passing from terminal 208 to terminal 206) then can be expressed as a combination of the currents through each non-linear inductor junction or:

$$I(\delta) = I_0\sin(\delta) + I_0\sin(\delta + 2\pi\Phi_L\Phi_0) + I_0\sin(\delta - 2\pi\Phi_L\Phi_0)$$

$$= \text{Im}\{I_0 e^{i\delta}(1 + e^{j2\pi\Phi R/\Phi 0} + e^{-i2\pi\Phi L/\Phi 0})\}$$

$$= I_{0e}(\Phi_R, \Phi_L)\sin[\delta + \phi(\Phi_R, \Phi_L)],$$

Where $I_{0e}$ is the effective critical current of the SQUID 200 as a function of $\Phi_R$ and $\Phi_L$, and $\phi$ is the effective phase offset of the current I ($\delta$) as a function of $\Phi_R$ and $\Phi_L$.

Figure 3A:
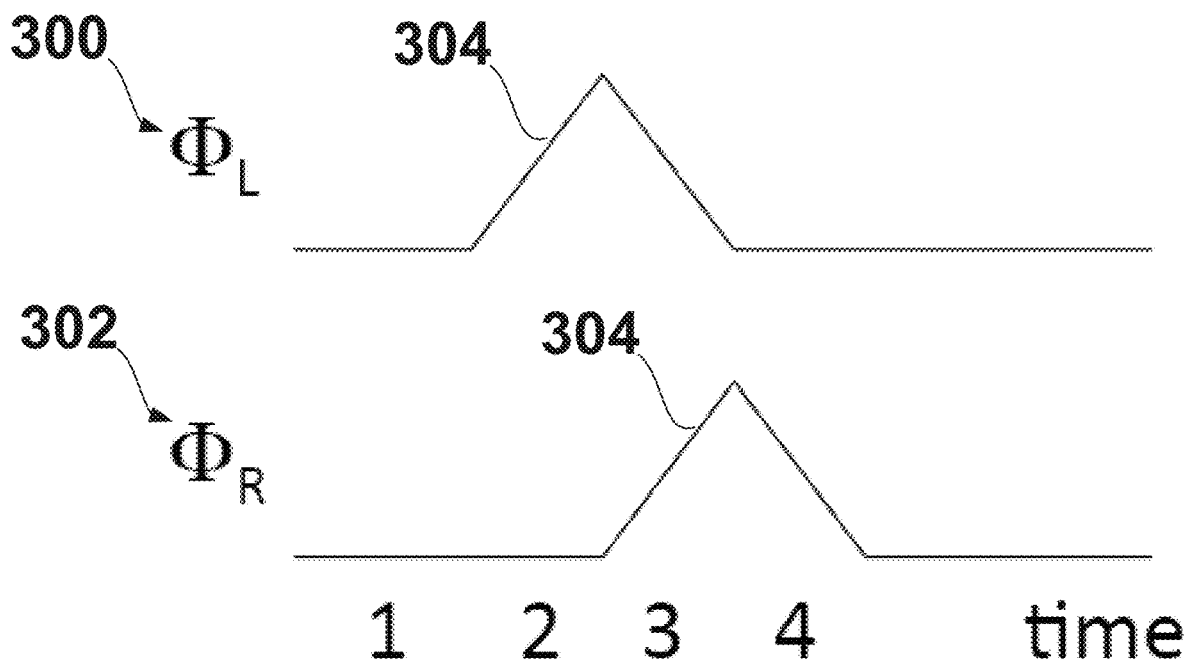
FIG. 3A is a schematic illustrating an example of first time-varying magnetic flux signal applied to a first sub-loop of a magnetic flux control device and a second time-varying magnetic flux signal applied to second sub-loop of the magnetic flux control device.

The foregoing equations apply to the limit where the inductance of the sub-loops is small (e.g., where the Josephson inductance of the magnetic flux control device is less than the loop inductance L of the magnetic flux control device). FIG. 3A is a schematic illustrating an example waveform of a first time-varying magnetic flux signal 300 (depicted as $\Phi_L$ in FIG. 3A) applied to the first sub-loop 240 of the SQUID 200 of FIG. 2 and a second time-varying magnetic flux signal 302 (depicted as $\Phi_R$ in FIG. 3A) applied to the second sub-loop 250 of the SQUID 200 of FIG. 2. It is possible to change the output state of the magnetic flux control device 100 by varying the first time-varying magnetic flux signal 300 and the second time-varying magnetic flux signal 302 according to predetermined criteria. In particular, it is possible to cause the effective phase offset $\phi$, and thus the superconducting phase, of a current I through the SQUID 200 to change by $2\pi n$, where n is an integer number. As explained herein, the current I through the magnetic flux device also can be expressed as $I=n\Phi_0/L$. Since each change in effective phase offset $\phi$ by $2\pi$ is equivalent to changing n by 1, the current I, which is proportional to n, also changes. That is, changing the effective phase offset by $2\pi$ changes the effective flux through the loop of the magnetic flux control device (where, e.g., the loop is defined by the trace 102 and the SQUID element 104) by $\Phi_0$, which changes the loop current by approximately $\Phi_0/L$. Thus, an integer change in n can be achieved by applying input signals to the SQUID 200 to change the phase associated with the Josephson junctions by $2\pi$. In contrast, when the signals (e.g., the magnetic flux signals) applied to the first sub-loop 240 and to the second sub-loop 250 do not meet the predetermined criteria, the output state of the magnetic flux control device does not change.

The waveforms 300 and 302 are examples of magnetic flux signals that meet predetermined criteria for changing the phase of the current I. The waveforms 300, 302 are divided into four separate periods of time, T=1, 2, 3 and 4. During the first time period, T=1, the magnitude of both flux 300 and flux 302 have the same initial value, e.g., both fluxes are zero. During the second time period, T=2, the magnitude of flux 300 linearly increases to a maximum value, such as the flux quantum $\Phi_0$, while the magnitude of flux 302 does not change from its initial value. For instance, the magnitude of flux 302 remains zero. During the third time period, T=3, the magnitude of flux 300 begins to linearly decrease toward a final value, whereas the magnitude of flux 302 begins to linearly increase to a maximum value, such as $\Phi_0$. In some implementations, the final value of flux 300 can be equal to the initial value, e.g., zero, though other final values are also possible. During the fourth time period, T=4, the magnitude of flux 300 does not change, whereas the magnitude of flux 302 begins to linearly decrease to a final value. For instance, in some implementations, the final value of flux 302 can be equal to the initial value, e.g., zero, though other final values are also possible.

Figure 3B:
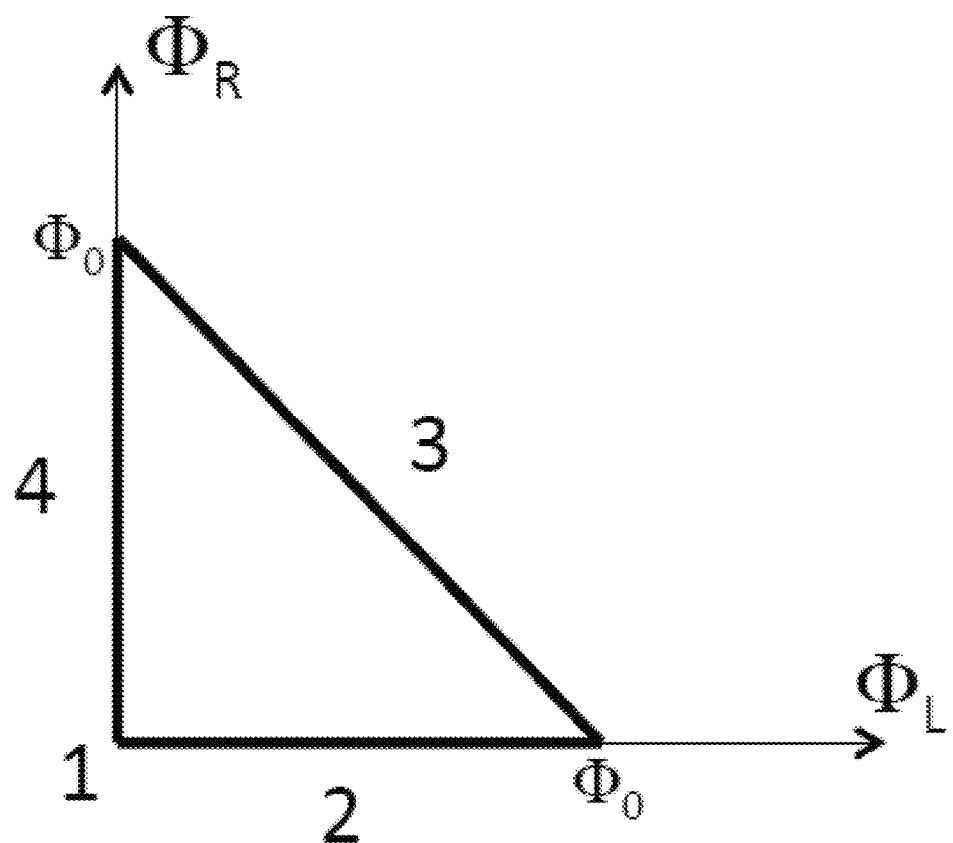
FIG. 3B is a plot illustrating the magnitude of the first magnetic flux waveform versus the magnitude of the second magnetic flux waveform of FIG. 3 for different points in time.
Figure 4:
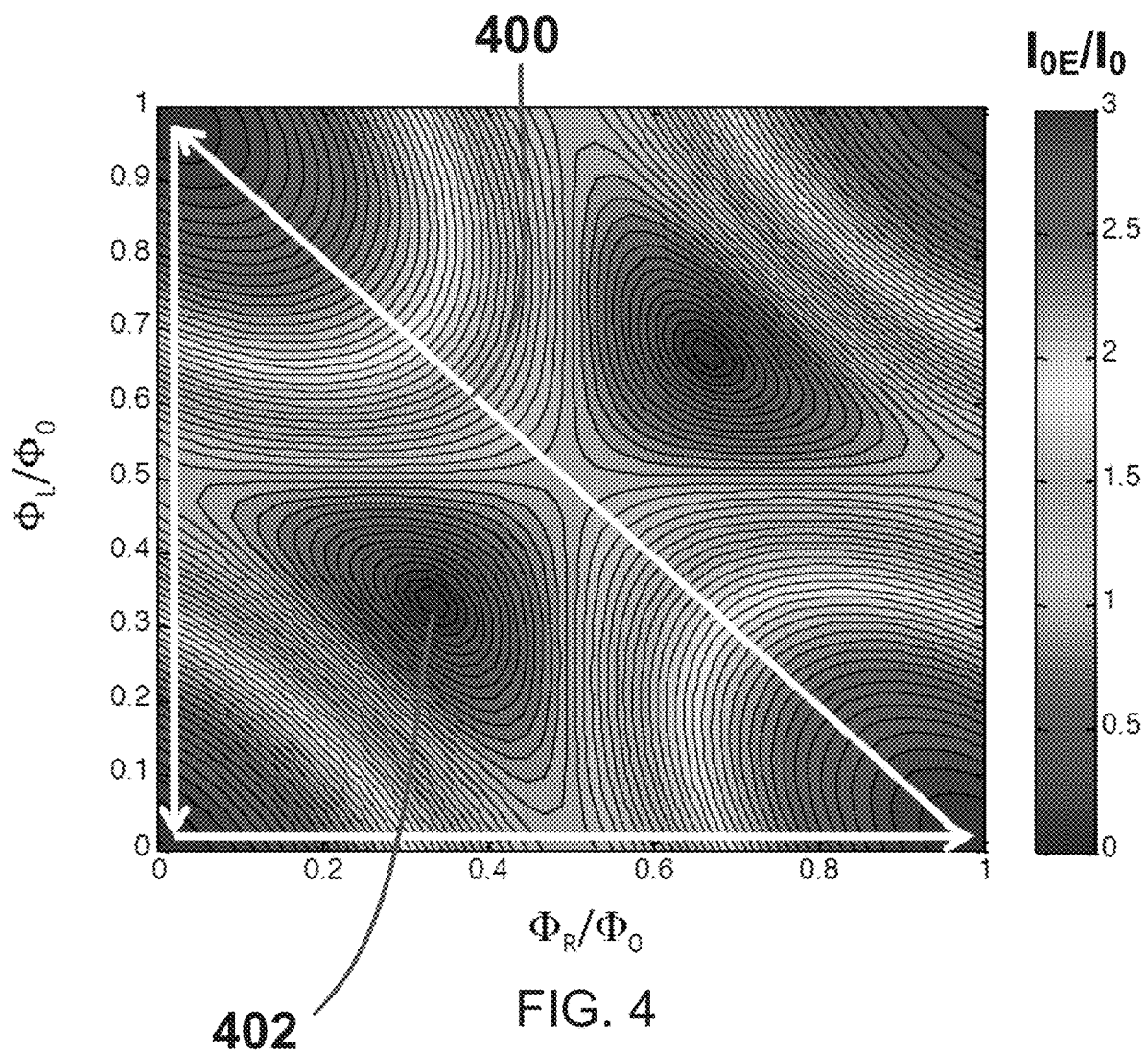
FIG. 4 is a plot illustrating the magnitude of a first magnetic flux signal normalized by flux quantum $\Phi_0$ versus the magnitude of a second magnetic flux signal normalized by flux quantum $\Phi_0$ overlaid against a heat map depicting the ratio of the magnitude of effective critical current $I_{0e}$ to critical current $I_0$ through a magnetic flux control device.

FIG. 3B is a plot of the magnitude of the first magnetic flux signal 300 (depicted as $\Phi_L$) against the magnitude of the second magnetic flux signal 302 (depicted as $\Phi_R$) for the different time periods T=1, 2, 3, and 4 shown in FIG. 3A. As illustrated in FIG. 3B, the magnitudes of the magnetic flux signals plotted against one another trace a closed-loop path, have maximum values of $\Phi_0$. By applying the magnetic flux signals in the foregoing manner, the phase across the magnetic flux control device changes by $2\pi$, that is, the effective flux through the magnetic flux control device changes by $\Phi_0$. The criteria required for the applied signals to cause a change in the effective phase offset $\phi$ by $2\pi$ can be understood by referring to FIGS. 4 and 5. FIG. 4 is a plot illustrating the magnitude of the first magnetic flux waveform 300 (represented in FIG. 4 as $\Phi_L$) normalized by $\Phi_0$ versus the magnitude of the second magnetic flux waveform 302 (represented in FIG. 4 as $\Phi_R$) normalized by $\Phi_0$ and overlaid against a heat map depicting the ratio of the magnitude of effective critical current $I_{0e}$ to critical current $I_0$ through the magnetic flux control device 100. The values of $\Phi_L/\Phi_0$ and $\Phi_R/\Phi_0$ trace a closed-loop path 400 around the heat map. For each position along the closed-loop path 400, the ratio $I_{0e}/I_0$ is determined by the heat map at that position. To obtain a change in the effective phase offset $\phi$ by $2\pi$, the applied fluxes trace a closed-loop path around a critical point 402 on the heat map. In the present example, the critical point 402 corresponds to the position at which the ratio $I_{0e}/I_0$ equals 0. Thus, when the magnetic fluxes applied to the first and second sub-loops of the SQUID 200 complete a closed-loop path around the critical point 402, the effective phase offset $\phi$ across the magnetic flux control device 100 changes by $2\pi$, leading to a change in n by 1. In the present example, the critical point 402 occurs at values $\Phi_L/\Phi_0$ and $\Phi_R/\Phi_0$ that are approximately equal to ⅓. The value at which the critical point occurs can change depending on the inductance of the magnetic flux control device loop (determined, e.g., by the trace 102 and SQUID element 104 shown in FIG. 1). When the magnetic fluxes are applied such that the closed-loop path 400 is traced in a counter-clockwise manner, the phase increases by $2\pi$ for each full revolution. For example, if the overlapping magnetic flux signals shown in FIG. 3A is repeated a second time, the effective phase offset across the magnetic flux device will increase by another $2\pi$ and n increases by 2.

Figure 5:
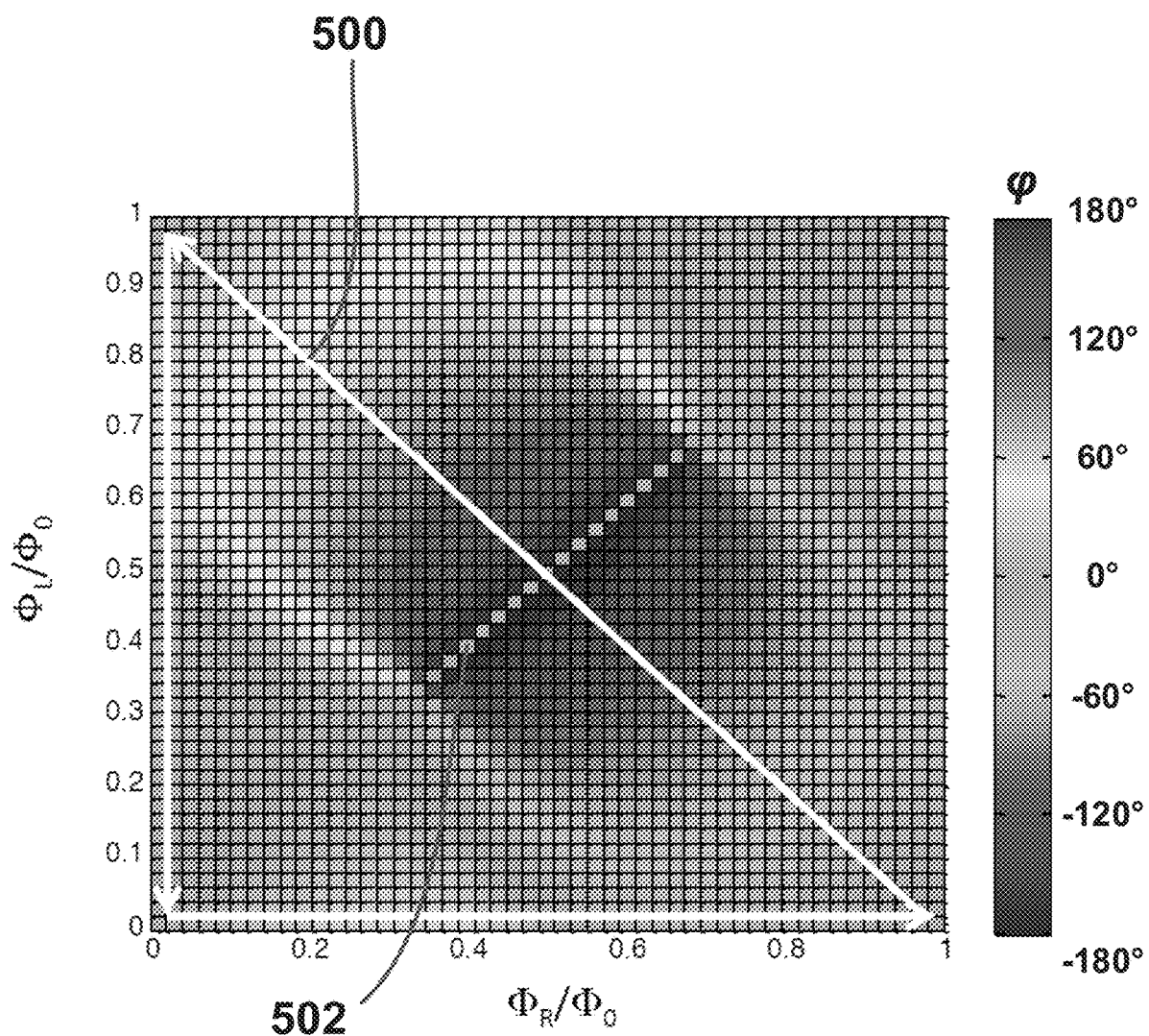
FIG. 5 is a heat map plot illustrating a phase of current through a magnetic flux control device as a function of magnetic flux ($\Phi_L/\Phi_0$) applied to a first loop of the magnetic flux control device and of magnetic flux ($\Phi_R/\Phi_0$) applied to a second loop of the magnetic flux control device.

The predetermined criteria for achieving a $2\pi$ phase change across the magnetic flux control device 100, and thus an integer change in the effective flux by $\Phi_0$, alternatively can be understood from FIG. 5. FIG. 5 is a plot illustrating the magnitude of the first magnetic flux waveform 300 (represented in FIG. 5 as $\Phi_L$) normalized by $\Phi_0$ versus the magnitude of the second magnetic flux waveform 302 (represented in FIG. 5 as $\Phi_R$) normalized by $\Phi_0$ and overlaid against a heat map depicting the phase offset $\phi$ ($\Phi_R$, $\Phi_L$) across the magnetic flux control device 100 (where the phase offset is represented in degrees). The values of $\Phi_L/\Phi_0$ and $\Phi_R/\Phi_0$ trace a closed-loop path 500 around the heat map. For each position along the closed-loop path 500, the effective phase offset across the magnetic flux control device is determined by the heat map at that position. To obtain a change in the phase offset $\phi$ ($\Phi_R$, $\Phi_L$) by $2\pi$, the closed-loop path passes through a location (e.g., the line 502) on the heat map where the phase goes from negative values through zero to positive values (or positive values through zero to negative values, depending on the direction the path is traced). Again, when the magnetic fluxes are applied such that the closed-loop path 500 is traced in a counter-clockwise manner, the effective phase offset increases by $2\pi$ for each full revolution.

As shown in FIG. 3A, the waveforms can be applied sequentially to each sub-loop of the SQUID 200 and can overlap in time. The specific trajectory traced by $\Phi_L/\Phi_0$ and $\Phi_R/\Phi_0$ is not critical to achieving the $2\pi$ phase change, so long as the predetermined criteria are met when applying the magnetic flux signals to the sub-loops of the SQUID 200. For example, the magnetic flux waveforms 300 and 302 are shown in FIG. 3 as phase-shifted saw-tooth patterns. Other waveforms can be used instead. For instance, the waveforms can have a sinusoidal or other shape. In some implementations, the change from the initial value to the maximum value in the first waveform and/or the second waveform can be obtained using a step-increase function. Alternatively, in some implementations, the change from the maximum value to the final value in the first waveform and/or the second waveform can be obtained using a step-decrease function. In some implementations, the maximum value achieved by the first waveform is different from the maximum value achieved by the second waveform. To achieve a change in n by 1, however, the maximum magnitude of the flux ($\Phi_L$ and $\Phi_R$) applied to each sub-loop of the SQUID 200 should not exceed the flux quantum value $\Phi_0$. In some implementations, the magnitude of the flux applied to each sub-loop of the SQUID 200 can exceed the flux quantum $\Phi_0$ such that additional critical points are encircled, leading to a change in n by an integer number greater than 1.

In some implementations, the waveform applied to the first sub-loop 240 of the SQUID 200 is not identical to the waveform applied to the second sub-loop 250 of the SQUID 200. In some implementations, initial and/or final values of the first waveform and/or of the second waveform are non-zero. The waveforms shown in FIG. 3A depict the magnitude of the fluxes increasing from a relatively low initial value to a higher maximum value and back to a low final value. However, in some implementations, the change in flux magnitude can be inverted. For example, the flux magnitude of each waveform can start at a relatively high initial value, decrease to a lower minimum value, and then increase to a higher final value. Such waveforms, when applied to the SQUID 200, can result in the triangle-shaped path shown in FIG. 3B being flipped laterally about a vertical axis.

The phase offset between the maximum value of the first waveform and the maximum value of the second waveform also can vary, so long as the waveforms overlap to achieve the predetermined criteria that allows the effective phase offset $\phi$ to change by $2\pi$. For example, although FIG. 3A shows the first waveform 300 reaching a maximum value before the second waveform 302 reaches a maximum value, the application of the waveforms can be reversed so that the second waveform 302 reaches a maximum value before the first waveform 300 reaches a maximum value. In this case, the trajectory traced by $\Phi_L/\Phi_0$ and $\Phi_R/\Phi_0$ would proceed in the opposite direction than that shown in FIG. 3B. That is, rather than proceeding around the closed-loop path in a counter-clockwise manner as shown in FIG. 3B, the trajectory traced by $\Phi_L/\Phi_0$ and $\Phi_R/\Phi_0$ would proceed in a clockwise manner. Reversing the trajectory traced by $\Phi_L/\Phi_0$ and $\Phi_R/\Phi_0$ causes the effective phase offset $\phi$ to decrease by integer multiples of $2\pi$ each time. With each $2\pi$ decrease in phase, the value n decreases by 1. Thus, the sign of the change in n is determined by the direction in which the trajectory of the magnetic fluxes applied to the SQUID sub-loops encircle the critical point. The absolute value for n is determined by the number of consecutive times that the input signals applied to the SQUID of the magnetic flux control device cause an increase or decrease in the effective phase offset by $2\pi$. For example, if the effective phase offset is increased by $6\pi$, then n=3. In another example, if the effective phase offset is decreased by $6\pi$, then n=−3. In another example, if the effective phase offset is increased by $6\pi$, and subsequently decreased by $2\pi$, then n=2.

To avoid coupling to the resonance frequencies of the sub-loops of SQUID 200, the flux applied to each sub-loop should be associated with a corresponding frequency that is less than the resonant frequency of the sub-loop (e.g., in some cases the resonant frequency of the SQUID sub-loop can be in the range of 10~50 GHz). In some implementations, reducing the frequency of the applied flux signal can reduce power dissipation of the device. This is because as the frequency of operation is reduced, the voltage produced by the device decreases. With lower voltage, the power dissipated through operation of the magnetic flux control device decreases.

Figure 6:
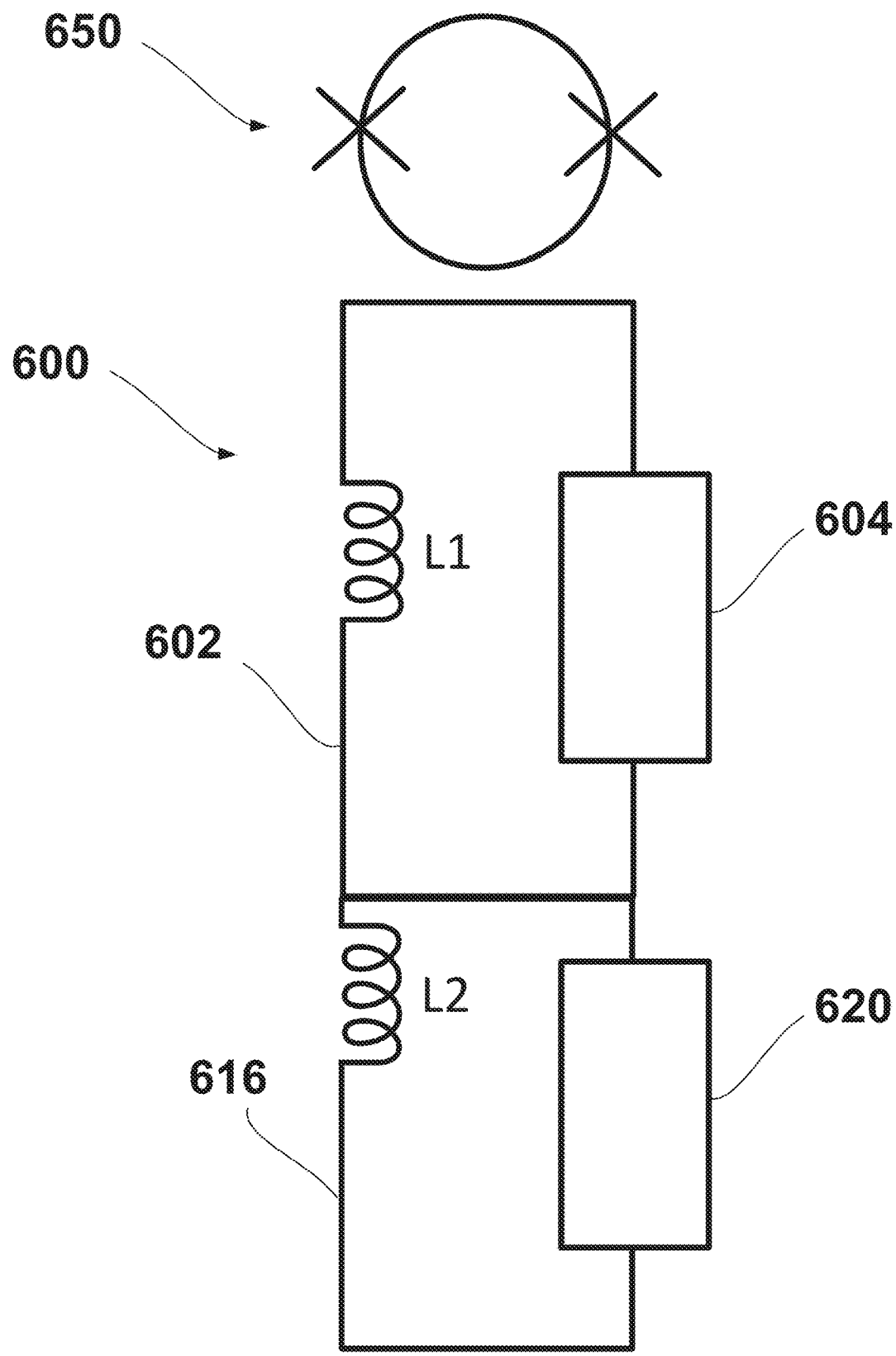
FIG. 6 is a schematic illustrating an example of a magnetic flux control device.

As explained with respect to FIG. 1, the current I through the magnetic flux device 100 can be expressed as $I=n\Phi_0/L$, where L is the inductance of the superconducting trace 102. To achieve even finer changes in I, the inductance of the superconducting trace 102 can be increased by adding additional inductive material to the device 100. For example, FIG. 6 is a schematic illustrating an example of a magnetic flux control device 600 in which the effective inductance L of the device 600 is modified by adding an additional loop of superconducting trace 616 and an additional 3-junction element 620 (e.g., a 3-junction SQUID, such as the SQUID 200 shown in FIG. 2) coupled to trace 602. The first portion of the device 600 containing the trace 602 and SQUID 604 is identical to the device 100 shown in FIG. 1 and is associated with an inductance $L_1$. The second portion of the device 600 includes the second trace 616 and additional 3-junction element 620 is associated with inductance $L_2$ and is coupled with trace 602. Through the addition of trace 616 and the 3-junction element 620, one can gain finer current control in the output current. This is because the quantized current in the lower loop (trace 616 and element 620) is shared among a common wire of the upper loop (trace 602 and element 604) and lower loop. Thus the quantized current in the lower loop $I_2=n_2\Phi_0/L_2$ produces a small flux $MI_2$ in the upper loop, proportional to the shared wires mutual inductance M, that then changes the output current with finer control $I=n_2\Phi_0 M/L_1 L_2$. In this way, the magnetic flux device enables even finer control over a second device 650, such as a qubit or qubit coupler element.

As explained herein, if the predetermined criteria are not met by the fluxes applied to the SQUID 200, then the value of n does not change. For instance, if the applied fluxes fail to trace a closed-loop path around a critical point corresponding to a current I=0, the value of n will not change. Alternatively, if the applied fluxes fail to trace a path through a point where the phase of the magnetic flux control device transitions between positive and negative values as described herein, then the value of n will not change.

The process for changing the output state of the magnetic flux control device is near adiabatic. In some implementations, the magnetic flux control devices of the present disclosure can dissipate a factor of $10^3$-$10^5$ less power than CMOS-based or SFQ-based control devices. Thus, the magnetic flux control device of the present disclosure generates very little heat. Furthermore, in contrast to other qubit control devices, such as SFQ-based control devices, the magnetic flux control devices of the present disclosure do not require the use of on-chip damping resistors. Because the power dissipation, and thus heat generation, of the magnetic flux control devices is so low, the magnetic flux control devices can be arranged on or near the same chip as quantum computing circuit elements without substantially increasing the local chip temperature above a desired operating temperature (e.g., 20 mK), without causing transitions to undesired energy states, or without contributing to decoherence.

The magnetic flux control devices of the present disclosure, such as devices shown in FIGS. 1 and 6, can be used as control elements for applying biases to one or more other devices, such as quantum circuit elements (e.g., quantum computing circuit elements). For example, in some implementations, a magnetic flux control device of the present disclosure can be used to apply a particular bias (e.g., a magnetic flux signal or a current signal) to a superconducting qubit (e.g., a flux qubit, a phase qubit or a charge qubit).

The bias from the magnetic flux control device can be used to initialize the superconducting qubit into a particular desired state, to tune an operating frequency of a superconducting qubit to a predetermined frequency, to tilt/perturb a double well potential exhibited by a superconducting qubit, and/or to adjust a magnitude of a barrier between potential wells exhibited by a superconducting qubit. For instance, by applying a first time-varying magnetic flux $\Phi_1$ to a first sub-loop of the SQUID element of the magnetic flux control device, and a second time-varying magnetic flux $\Phi_2$ to a second sub-loop of the SQUID, in which the first time-varying magnetic flux $\Phi_1$ and the second time-varying magnetic flux $\Phi_2$ meet predetermined criteria as explained herein, a bias supplied by the magnetic flux control device can be changed by a non-zero integer multiple n. For example, a magnetic flux signal or current signal generated by the magnetic flux control device can be incremented or decremented by a non-zero integer multiple n of the flux quantum $\Phi_0$, leading to a change in a state (e.g., operating frequency) of the qubit.

In some implementations, a magnetic flux control device of the present disclosure, such as the devices shown in FIGS. 1 and 6, can be used to apply a particular bias (e.g., a magnetic flux signal or a current signal) to a superconducting qubit coupling element. The bias from the magnetic flux control device can be used to increase or decrease the coupling strength of the superconducting qubit coupling element, such that a level of coupling between two or more qubits can be modified. For example, by applying a first time-varying magnetic flux $\Phi_1$ to a first sub-loop of the SQUID element of the magnetic flux control device, and a second time-varying magnetic flux $\Phi_2$ to a second sub-loop of the SQUID, in which the first time-varying magnetic flux $\Phi_1$ and the second time-varying magnetic flux $\Phi_2$ meet predetermined criteria as explained herein, a magnetic flux signal or current signal generated by the magnetic flux control device can be incremented or decremented by a non-zero integer multiple n of the flux quantum $\Phi_0$, leading to a corresponding change in the coupling strength of the superconducting qubit coupling element. Alternatively, or in addition, the bias generated by the magnetic flux control device can be used to tune a frequency of the qubit coupler.

The magnetic flux control device according to the present disclosure requires at least two input signals (e.g., one for each sub-loop of the SQUID) and only changes an output state (e.g., a current I or flux M) when the input signals meet predetermined criteria. In all other circumstances, the output state of the device does not change. Accordingly, in some implementations, the magnetic flux control device is suitable for use as a logical AND gate. That is, only when input signals having the requisite predetermined criteria are applied to both sub-loops of the SQUID can the effective phase offset of the device change by $2\pi$, such that an effective flux through the device changes by a flux quantum $\Phi_0$ (e.g., output a 1). In all other instances (i.e., when only one magnetic flux signal has the requisite time-varying magnitude is applied or when no magnetic flux signals having the requisite time-varying magnitude are applied), the effective flux does will not change (e.g., output a 0).

Figure 7:
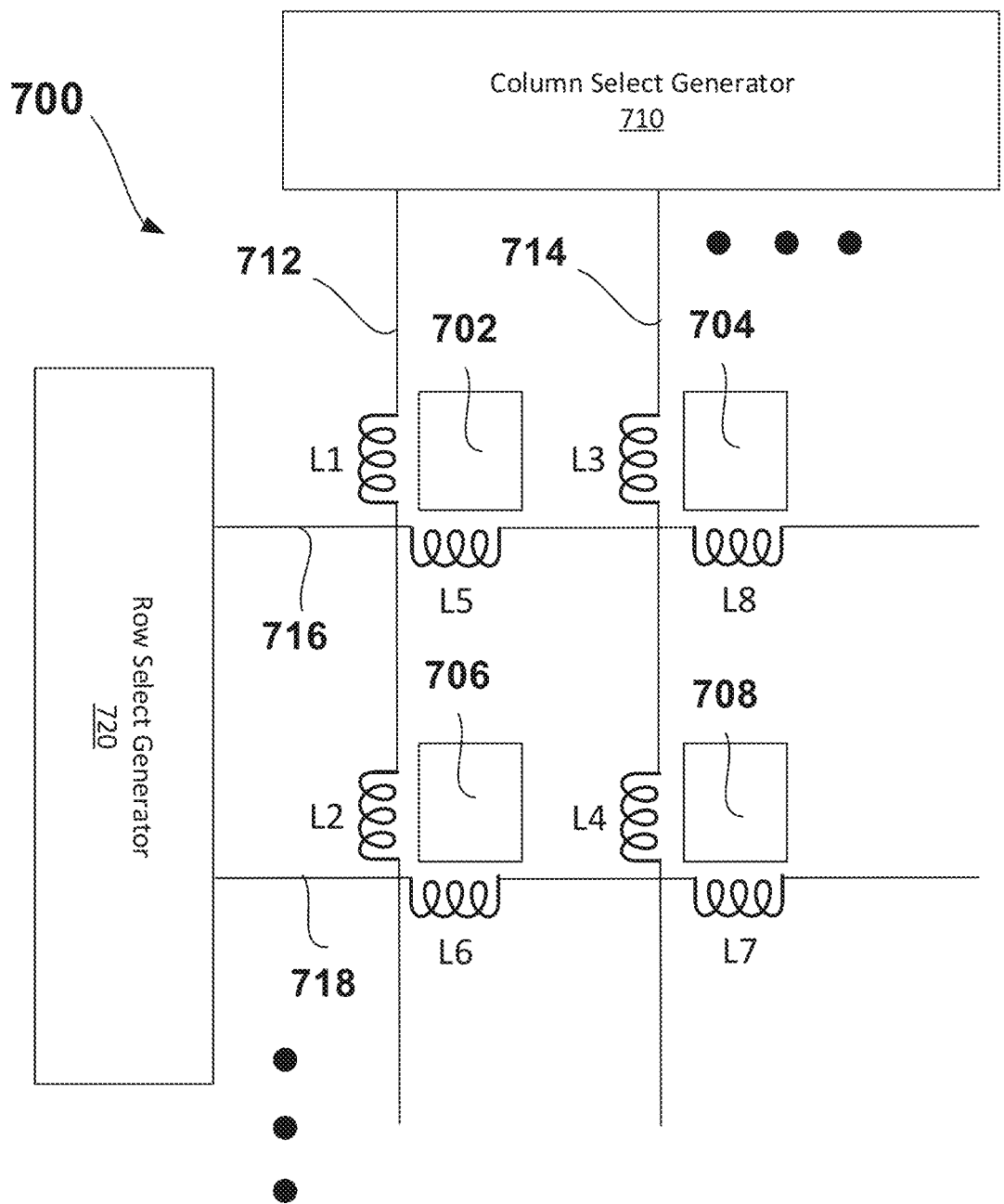
FIG. 7 is a schematic illustrating an example of a controllable matrix array of magnetic flux control elements.

In some implementations, multiple magnetic flux control devices can be combined with corresponding circuit elements (e.g., quantum circuit elements) in an array to provide controllable matrix addressing of the circuit elements (e.g., the quantum circuit elements). FIG. 7 is a schematic illustrating an example of a controllable matrix array 700 of magnetic flux control devices. As shown in FIG. 7, the array 700 includes multiple cells 702, 704, 706, and 708 arranged in rows and columns. Each cell 702, 704, 706, and 708 includes a magnetic flux control device, such as the magnetic flux control devices described herein. For example, in some implementations, the magnetic flux control device includes a superconducting trace coupled to a SQUID having three non-linear inductor junctions coupled in parallel. Each cell 702, 704, 706, and 708 also includes a circuit element positioned adjacent to the magnetic flux control device. The circuit element can include, e.g., a qubit and/or a qubit coupling element. Other circuit elements are also possible.

The array 700 also includes multiple vertical control lines (e.g., control line 712, 714). Each vertical control line extends along a corresponding column of the array 700 and is positioned next to each cell within the column. For example, control line 712 is positioned next to cells 702 and 706, whereas control line 714 is arranged next to cells 704 and 708. The vertical control lines can be formed from superconducting traces and are associated with corresponding inductances.

The array 700 also includes multiple horizontal control lines (e.g., control line 716, 718). Each horizontal control line extends along a corresponding column of the array 700 and is positioned next to each cell within the column. For example, control line 716 is positioned next to cells 702 and 704, whereas control line 718 is arranged next to cells 706 and 708. The horizontal control lines can be formed from superconducting traces and are associated with corresponding inductances.

The vertical control lines (e.g., lines 712, 714) are coupled to (e.g., electrically connected to) a column select generator 710. The horizontal control lines (e.g., lines 716, 718) are coupled to (e.g., electrically connected to) a row select generator 720. Each of column select generator 710 and row select generator includes circuitry (e.g., a current source) configured to generate a waveform that is applied to a control line. The column and row select generators can be configured to provide a unique waveform to each control line to which the generator is coupled. For example, in some implementations, the column select generator can be programmed to deliver a unique waveform to each vertical control line, whereas the row select generator can be programmed to deliver a unique waveform to each horizontal control line.

Thus, given an i×j matrix of cells, where each cell includes a circuit element (e.g., a quantum circuit element such as a qubit or qubit coupler element) and a corresponding magnetic flux control device, the number of connectors needed to address the circuit elements is i+j. Furthermore, the magnetic flux control device of each cell of the matrix serves to actively maintain the state of the circuit element while other cells are being addressed, thus preventing crosstalk from inadvertently changing the state of an unaddressed cell. That is, when input signals meeting the predetermined criteria as described herein are supplied to a magnetic flux control device, the magnetic flux control device is placed in a persistent output state (e.g., the magnetic flux control device generates a persistent current) that does not change, until and unless input signals meeting the predetermined criteria again are applied to change the output state. Accordingly, there is no need to provide continuous application of input signals to a cell to maintain a desired output state. Furthermore, because the control device can actively maintain the state of the circuit element, the total power dissipation required to address the array is significantly lower than it would be if each cell had to be addressed continuously to maintain its state.

In some implementations, the magnetic flux control device of the present disclosure can be used as a multi-level memory device. As explained herein, the current I through the magnetic flux device can be expressed as I=M/L, where M is the flux through the superconducting loop of the device and can be expressed as $M=n\Phi_0$. With each $2\pi$ change in effective phase offset of the magnetic flux control device, the integer value n changes by 1, leading to a corresponding change in the output state (e.g., the current I or flux M) of the magnetic flux control device. The output state of the magnetic flux control device does not change unless there is another $2\pi$ change in the effective phase offset of the device. Thus, the magnetic flux control device can be placed in various different output or "memory" states depending on the value of n. That is, the different values of I (or the different magnetic fluxes M) generated by the control device can represent different memory states, in which each memory state will be maintained until and unless the appropriate flux signals are applied to the magnetic flux control device to change n again.

FIG. 8 is a table that illustrates an example of different output states that can be established by a multi-level memory based on the magnetic flux control device according to the present disclosure. As shown in FIG. 8, four different output states of a magnetic flux control device, such as device 100, are presented. Each output state is mapped to corresponding bits of information. For example, the multi-level memory can be programmed to be in one of four different memory states, e.g. n, n+1, n+2, and n+3 that correspond to binary values "00", "01", "10", and "11", respectively. Writing to the multi-level memory includes applying flux signals to the SQUID element of the magnetic flux control device, in which the flux signals satisfy the predetermined criteria required for the change in effective phase offset, $\Delta\varphi_0$, of the device to be an integer multiple of $2\pi$. The change in effective phase offset, $\Delta\varphi_0$, shown in the table of FIG. 8 is evaluated from a first memory state, n. For instance, to change the memory state of the multi-level memory from a first memory state to a second memory state (e.g., from "00" to "01"), flux signals are applied to the device to change the effective phase offset by $2\pi$. To change the device from the first memory state to a third memory state (e.g., from "00" to "10"), flux signals are applied to the device to change the phase by $4\pi$. To change the device from the first memory state to a fourth memory state (e.g., from "00" to "11"), flux signals are applied to the device to change the effective phase offset by $6\pi$. Similarly, to change the device from the fourth memory state to the first memory state (e.g., from "11" to "00"), flux signals are applied to the device to change the effective phase offset by $-6\pi$. To change the device from the fourth memory state to the second memory state (e.g., from "11" to "01"), flux signals are applied to the device to change the effective phase offset by $-4\pi$. To change the device from the fourth memory state to the third memory state (e.g., from "11" to "10"), flux signals are applied to the device to change the effective phase offset by $-2\pi$. Although the device associated with FIG. 8 is represented as having only four different memory states, other numbers of memory states also can be used. In some implementations, the limit to the number of memory states can be defined based on what time period is acceptable for changing the phase of the memory device.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin).

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Accordingly, other implementations are within the scope of the following claims.

What is claimed is:

1. A device comprising:
    a first device comprising
        a superconducting trace, and
        a superconducting quantum interference device (SQUID) having at least three non-linear inductor junctions coupled in parallel, wherein a first terminal of the SQUID is electrically coupled to a first end of the superconducting trace, and a second terminal of the SQUID is electrically coupled to a second end of the superconducting trace to form a loop; and
    a second device arranged proximate to the first device, wherein a state of the second device is controllable by a bias generated by the first device.

2. The device of claim 1, wherein the second device is a qubit.

3. The device of claim 1, wherein the second device is a qubit coupler element.

4. A system comprising:
    a plurality of cells arranged in an array of i rows by j columns, i being an integer number greater than or equal to 1, j being an integer number greater than or equal to 2, wherein each cell of the plurality of cells comprises a corresponding magnetic flux control device comprising:
        a superconducting trace, and
        a superconducting quantum interference device (SQUID) having at least three non-linear inductor junctions coupled in parallel, wherein a first terminal of the SQUID is electrically coupled to a first end of the superconducting trace, and a second terminal of the SQUID is electrically coupled to a second end of the superconducting trace to form a loop.

5. The system of claim 4, wherein each cell of the plurality of cells further comprises a corresponding second device positioned proximate to the magnetic flux control device.

6. The system of claim 5, wherein, for each cell of the plurality of cells, the second device comprises a qubit.

7. The system of claim 5, wherein, for each cell of the plurality of cells, the second device comprises a qubit coupler element.

8. The system of claim 5, further comprising:
    i first control lines, wherein each first control line of the i first control lines extends along a corresponding row of the array and is couplable to each magnetic flux control device within the corresponding row; and
    j second control lines, wherein each second control line of the j control lines extends along a corresponding column of the array is couplable to each magnetic flux control device within the corresponding column.

9. The system of claim 8, further comprising:
    a row select generator coupled to the i first control lines, the row select generator configured to provide a unique corresponding signal to each first control line of the i first control lines; and
    a column select generator coupled to the j second control lines, the column select generator configured to provide a unique corresponding signal to each second control line of the j second control lines.

10. A method of operating a multi-level memory device comprising (a) a superconducting trace and (b) a superconducting quantum interference device (SQUID) having at least three non-linear inductor junctions coupled in parallel, wherein a first terminal of the SQUID is electrically coupled to a first end of the superconducting trace, and a second terminal of the SQUID is electrically coupled to a second end of the superconducting trace to form a loop, the method comprising:
    applying a first time-varying magnetic flux $\Phi_1$ to a first sub-loop of the SQUID, and applying a second time-varying magnetic flux $\Phi_2$ to a second sub-loop of the SQUID, to place the multi-level memory device in a first memory state.

11. The method of claim 10, wherein applying the first time-varying magnetic flux $\Phi_1$ and applying a second time-varying magnetic flux $\Phi_2$ causes an output state of the multi-level memory device to change by a non-zero integer n.

12. The method of claim 10, further comprising applying a third time-varying magnetic flux $\Phi_3$ to the first sub-loop of the SQUID, and applying a fourth time-varying magnetic flux $\Phi_4$ to the second sub-loop of the SQUID, to place the multi-level memory device in a second memory state, wherein the second memory state is different than the first memory state.

* * * * *